United States Patent [19]
Lee

[11] Patent Number: 6,150,700
[45] Date of Patent: Nov. 21, 2000

[54] ADVANCED NOR-TYPE MASK ROM

[75] Inventor: Woon-Kyung Lee, Seoul, Rep. of Korea

[73] Assignee: Samsung Electronics Co., Ltd., Suwon, Rep. of Korea

[21] Appl. No.: 09/232,685

[22] Filed: Jan. 19, 1999

[30] Foreign Application Priority Data

Jan. 19, 1998 [KR] Rep. of Korea ................ 98/1378

[51] Int. Cl.[7] .................. H01L 29/76; H01L 29/94; H01L 31/062; H01L 31/113; H01L 31/119
[52] U.S. Cl. .................. 257/391; 257/390; 257/392
[58] Field of Search .................... 257/390–392

[56] References Cited

U.S. PATENT DOCUMENTS

| | | | |
|---|---|---|---|
| 5,117,389 | 5/1992 | Yiu ........................ | 257/390 |
| 5,358,879 | 10/1994 | Brady et al. ............. | 438/302 |
| 5,877,537 | 3/1999 | Aoki ...................... | 257/390 |

FOREIGN PATENT DOCUMENTS 6-151773  5/1994  Japan ............................ 257/391

*Primary Examiner*—Tom Thomas
*Assistant Examiner*—Thien F Tran
*Attorney, Agent, or Firm*—Jones Volentine, LLC

[57] ABSTRACT

A NOR-type mask ROM includes a semiconductor substrate of a first conductivity type. A plurality of buried diffusion regions of a second conductivity type opposite to the first conductivity type are arranged in parallel on the substrate to serve as sources and drains. A plurality of channel regions are defined between the buried diffusion regions and a plurality of gate insulating layers are formed on the channel regions. A plurality of gate regions are formed in parallel on the gate insulating layers, intersecting the buried diffusion regions, and overlapping with the channel regions, to be provided as word lines. An insulating layer is deposited on the overall surface of the substrate, covering the gate regions, and a plurality of sub-gate regions are formed into spacers on the sidewalls of the insulating layer, in parallel with the gate regions, for increasing a cell current.

8 Claims, 8 Drawing Sheets

ADVANCED NOR-TYPE MASK ROM

CROSS-REFERENCES TO RELATED APPLICATIONS

The present application claims priority under 35 U.S.C. §119 to Korean Patent Application No. 98-1378 filed on Jan. 19, 1998, the entire contents of which are hereby incorporated by reference.

BACKGROUND OF THE INVENTION

1. Field of the Invention

The present invention relates to a nonvolatile memory device, and in particular, to an advanced NOR-type mask ROM (read-only memory) and a fabricating method thereof.

2. Description of the Related Art

To satisfy the demands for high integration, low cost, and high-speed operation, mask ROM cell structures have recently shifted from a NAND type to a NOR type. A conventional NOR-type cell is operated at high speed with a high cell current but with an increased cell area. In contrast, a conventional NAND-type cell occupies a small cell area and thus can be packed on a chip with high density, but has a low cell current.

NOR flat cells are those that have recently been developed to be free of a field oxide film for isolating devices and made as small as a NAND-type cell, while still having the advantages of a NOR-type cell. Such a NOR flat cell offers the benefits of high speed and low voltage operation with a relatively high cell current and excellent cell uniformity. Such a NOR flat cell also facilitates application of a multi-bit or multi-level memory for storing several items of data in one cell. For an example of a flat cell array and a fabricating method thereof, see U.S. Pat. No. 5,117,389 by Tom D.H. Yiu. Also, for an example high-density ROM memory cell fabricating technology, see U.S. Pat. No. 4,974,042 by Ashida et al.

Conventional fabrication of a flat-cell ROM involves exposing the surface of a silicon substrate between $N^+$ buried layers or between an $N^+$ buried layer and a P-well while patterning a gate. The exposed substrate surface may be overetched due to a process margin in etching back a gate spacer for formation of an LDD (Lightly Doped Drain) structure in a peripheral region. Hence, junctions, such as an N/P junction, in completed transistors are destroyed and pitted, resulting in a decrease in the breakdown voltage of the transistors. Furthermore, a reduced design rule leads to the decrease of a channel width to the width of a gate electrode in a cell transistor and of a cell current, thereby impeding low voltage operation.

In many cases of the related art, a source/drain of a transistor in a peripheral region is formed by ion implantation in self alignment with a gate or a spacer, making it difficult to employ a butted contact as a word line contact due to an exposed P-well or substrate. That is, when a contact hole for a butted contact is formed to cross over a gate poly and part of the exposed substrate, the gate is connected to the source/drain by a metal filled in the contact hole. Therefore, the butted contact is not available. To form a desirable word line contact through an interlayer insulating layer on a gate poly in a structure other than the above butted contact, process margin should be ensured against misalignment and variation in the critical dimension of skew. Thus, the word line being the gate poly is formed to be wider than a contact hole in order to account for the process margin. This increased word line width increases chip area and impedes realization of high integration.

As described above, the conventional flat-cell ROM cannot operate at low voltage and high speed if a cell transistor has a low cell current due to junction destruction and reduced breakdown voltage. Another problem is that since a butted contact cannot be used as a contact for supplying a voltage to a word line, a contact margin should be ensured, resulting in a wider word line and, thus, an increased chip area.

SUMMARY OF THE INVENTION

Therefore, it is an object of the present invention is to provide an advanced memory cell and a fabricating method thereof to overcome the above conventional problems.

Another object of the present invention is to provide a NOR-type mask ROM in which the surface of a substrate at a junction is not exposed so as to increase the current driving capability of a cell.

A further object of the present invention is to provide a NOR-type mask ROM and a fabricating method thereof, which can reduce the number of steps in an ion-implantation mask process and contribute to the realization of high integration.

Still another object of the present invention is to provide an advanced NOR-type mask ROM and a fabricating method thereof, which enable low-voltage, high-speed operation, and high integration to be achieved by allowing formation of a butted contact for supplying a voltage to a word line.

To achieve at least one of the above and other objects, there is provided a NOR-type mask ROM. In the NOR-type mask ROM, a semiconductor substrate has a first conductivity type. A plurality of buried diffusion regions of a second conductivity type opposite to the first conductivity type are arranged in parallel on the substrate to serve as sources and drains. A plurality of channel regions are defined between the buried diffusion regions and a plurality of gate insulating layers are formed on the channel regions. A plurality of gate regions are formed in parallel on the gate insulating layers, intersecting the buried diffusion regions, and overlapping with the channel regions, to serve as word lines. An insulating layer is deposited on the overall surface of the substrate covering the gate regions, and a plurality of sub-gate regions are formed into spacers on the sidewalls of the insulating layer, in parallel with the gate regions, for increasing a cell current.

According to another aspect of the present invention, there is provided a NOR-type mask ROM. In the NOR-type mask ROM, channel regions of a first conductivity type are defined on a semiconductor substrate in a cell array region. A plurality of field oxide films are formed in an interface region. A plurality of first buried diffusion regions of a second conductivity type opposite to the first conductivity type are arranged in parallel on the substrate to serve as sources and drains at both sides of the channel regions. A plurality of second buried diffusion regions are formed into islands isolated by the field oxide films. A plurality of gate insulating layers are formed on the channel regions and on the first and second buried diffusion regions in the cell array region and the interface region. A plurality of gate regions are formed in parallel on the gate insulating layers, intersecting the buried diffusion regions to serve as word lines. An insulating layer is deposited on the overall surface of the substrate, covering the gate regions. A plurality of sub-gate regions are formed into spacers on the sidewalls of the insulating layers, in parallel with the gate regions, for increasing a cell current. A metal word line is extended from the peripheral region, for supplying a voltage to the gate regions, and a butted contact is formed across a gate region, a sub-gate region, and a buried diffusion region through the insulating layer in the interface region, for connecting the metal word line to the buried diffusion region, the sub-gate region, and the gate region.

According to a third aspect of the present invention, there is provided a method of fabricating a NOR-type mask ROM having a cell array region, an interface region, and a peripheral region. The method includes forming a plurality of field oxide films on a semiconductor substrate of a first conductivity type, for electrically isolating the cell array region from the peripheral region and defining an active region for a logic circuit transistor in the peripheral region. Then, a plurality of buried diffusion regions of a second conductivity type opposite to the first conductivity type are formed in parallel on the substrate, to be provided sources and drains at both sides of channel regions in memory cells. Simultaneously, a buried diffusion region is formed into an island on the substrate isolated by the field oxide films in the interface region, to be provided as a conductive pad for a word line contact. A gate insulating layer is deposited on the overall surface of the resultant structure, a plurality of gate regions are formed as word lines in parallel on the gate insulating layer to intersect with the buried diffusion regions and overlap with the channel regions in the cell array region and the interface region, and a plurality of gate regions for logic circuit transistors are formed on the gate insulating layer in the peripheral region. Subsequently, an insulating layer is formed on the overall surface of resultant structure including the gate regions, a plurality of sub-gate regions are formed into spacers on the sidewalls of the insulating layer, in parallel with the gate regions, a mask pattern is formed to open only the peripheral region, for forming a source/drain of the logic circuit transistor in a lightly doped drain (LDD) structure, a source/drain impurity is ion implanted into the substrate with a high concentration, the sub-gate regions are removed from the peripheral region, the source/drain impurity is ion implanted again with a low concentration, and the mask pattern is removed. Thereafter, an interlayer insulating layer is formed on the resultant structure, a contact hole is formed as a word line contact through the interlayer insulating layer and the insulating layer in the interface region, and a metal word line is formed by filling a metal in the contact hole and patterning the metal, to intersect the gate regions and connect with the conductive pad, the gate regions, and the sub-gate regions.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
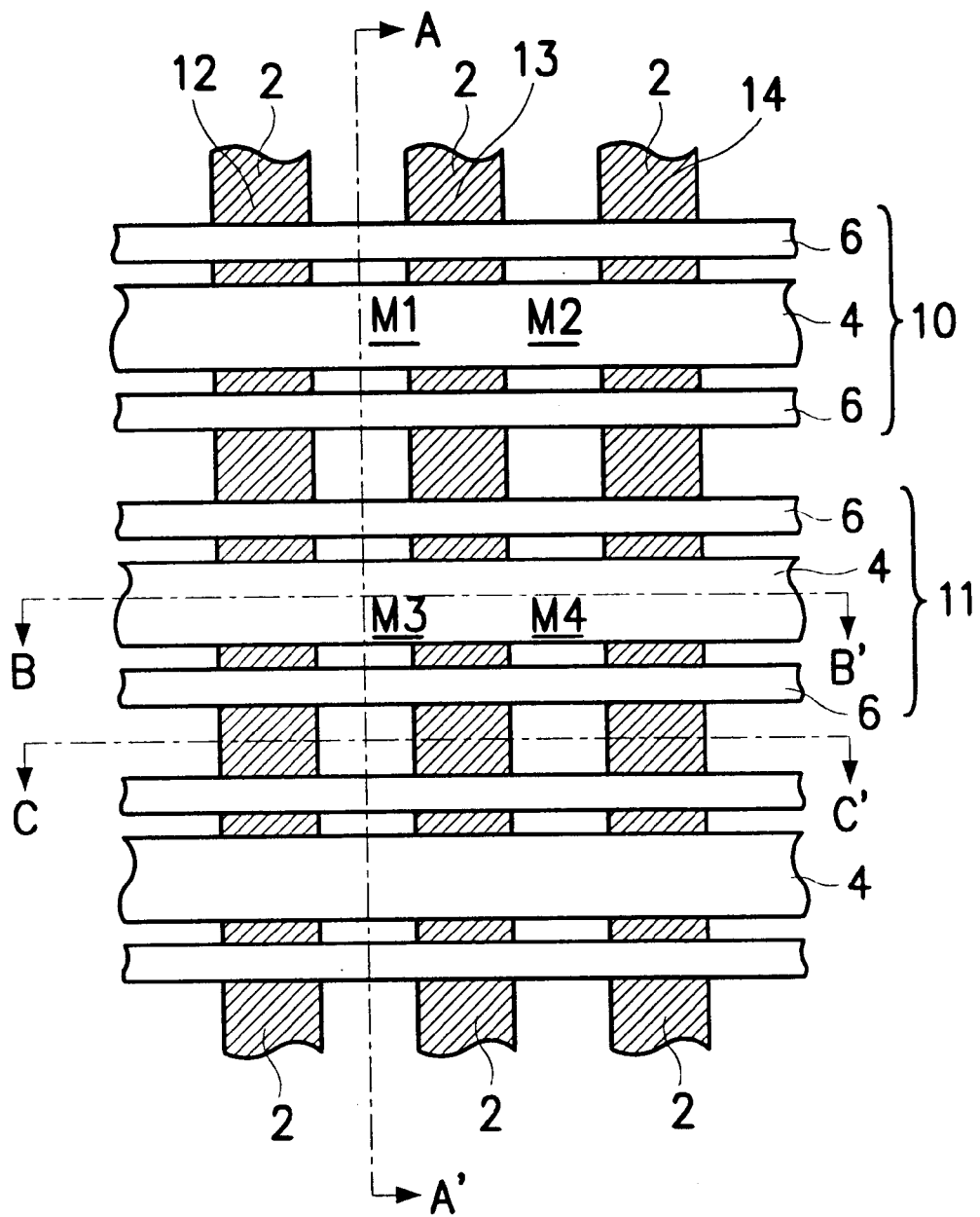
FIG. 1 is a plan view of a NOR-type mask ROM according to an embodiment of the present invention.

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Also, when a layer is defined to exist on another layer or a substrate, the layer may exist directly on another layer or substrate, or an interlayer layer may be present therebetween. Throughout the drawings, the same reference numerals denote the same elements.

FIG. 1 is a plan view of a NOR-type mask ROM according to an embodiment of the present invention. Referring to FIG. 1, cells are arranged, for example, in an array of three columns and two rows. $N^+$ buried diffusion regions 2, arranged in parallel on a semiconductor substrate, are provided as source/drain regions of ROM cell transistors, and gate regions 4 as gates of the cell transistors. Sub-gate regions 6 are formed into spacers, for increasing a cell current. Cell transistors M1 and M2 are disposed at points where a word line 10 intersect bit lines 12 and 13, and cell transistors M3 and M4 are disposed at points where a word line 11 intersects the bit lines 12 and 13.

Figure 2A:
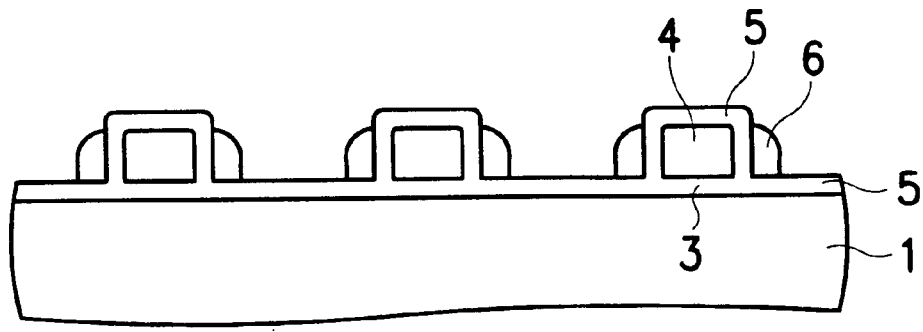
FIGS. 2A, 2B, and 2C are sectional views of the NOR-type mask ROM, taken along lines A–A', B–B', and C–C' of FIG. 1, respectively.
Figure 2B:
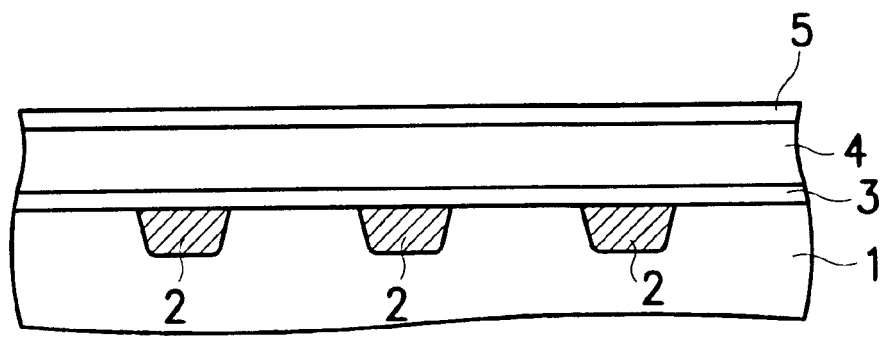
Figure 2C:
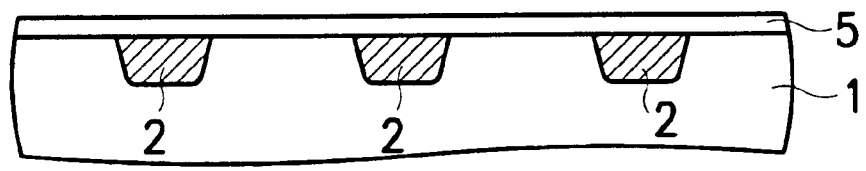
Figure 2D:
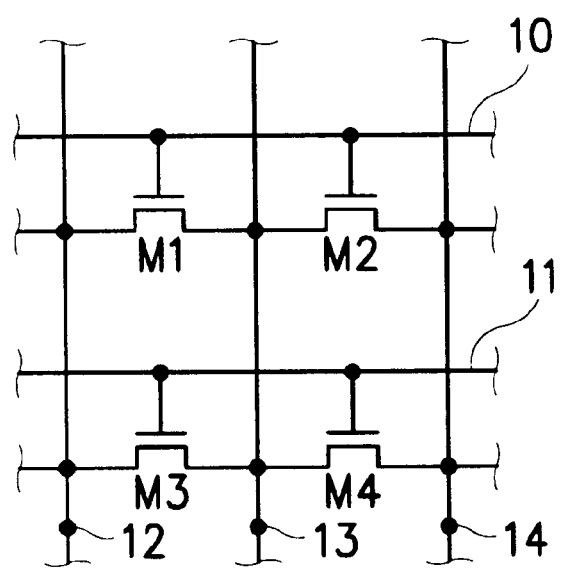
FIG. 2D is a partial equivalent circuit diagram of the NOR-type mask ROM shown in FIG. 1.

FIGS. 2A, 2B, and 2C are sectional views of the NOR-type mask ROM, taken along lines A–A', B–B', and C–C' of FIG. 1, respectively. FIG. 2D is a partial equivalent circuit diagram of the NOR-type mask ROM shown in FIG. 1.

Referring to FIGS. 2A to 2C, a flat cell according to the embodiment of the present invention includes a gate insulating layer 3, a gate region 4 (or a gate electrode 4) deposited on the gate insulating layer 3, an insulating layer 5 covering the gate region 4, and sub-gate regions 6 formed into spacers on the sidewalls of the insulating layer 5 in parallel with the gate region 4. The insulating layer 5 may be a regrown oxide film formed following patterning of the gate electrode 4, and the sub-gate regions 6 may be formed of the same material as that for the gate region 4, for example, polysilicon. Since the oxide film 5 covers the surface of a substrate 1 in an active region, junction destruction and reduction of a breakdown voltage are minimized. The oxide film 5 acts as an etch stopper during etching of the material for formation of the sub-gate regions 6 being poly spacers, thereby preventing the substrate 1 from being pitted. In addition, because the same voltage is applied to both the gate electrode 4 and the sub-gates 6 in operating a cell transistor, the effective width of the gate electrode 4, that is, the effective width of a channel formed in a well or the substrate 1, and a cell current are increased. Thus, cell transistors constructed in accordance with the present invention can operate at low voltages and high speeds.

FIGS. 3 to 6 are sectional views sequentially illustrating a process of forming flat cells of a cell array region and a transistor of a peripheral region in a NOR-type mask ROM according to another embodiment of the present invention.

Figure 3:
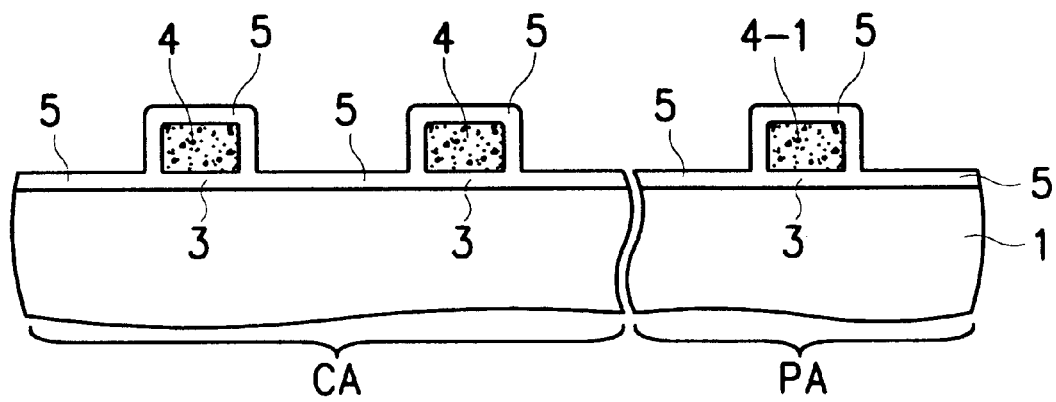
FIGS. 3 to 6 are sectional views sequentially illustrating a process of forming flat cells in a cell array region and a transistor in a peripheral region according to another embodiment of the present invention.
Figure 8:
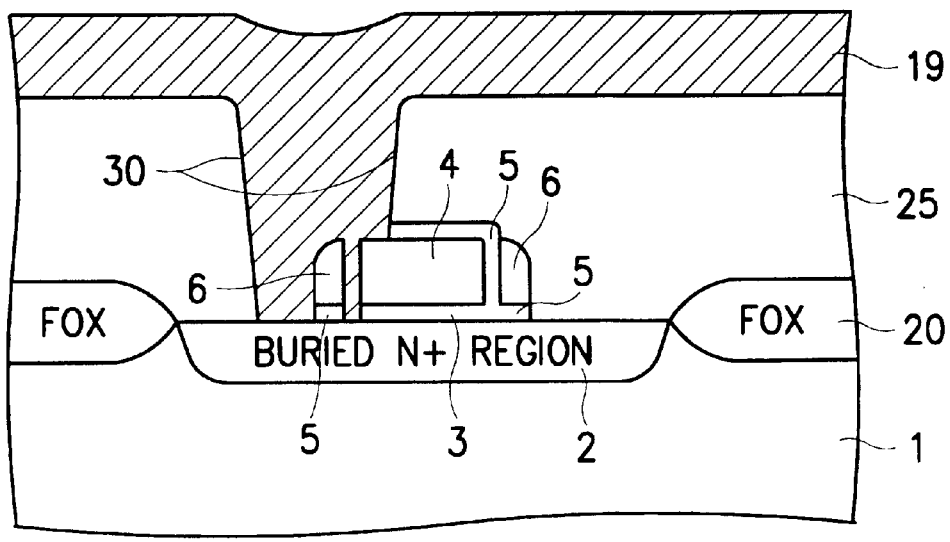
FIGS. 8 and 9 are sectional views of butted contact which can be formed in misalignment in connection with FIG. 7.

FIG. 3 illustrates the regrowing of the oxide film 5 by thermal oxidation. In FIG. 3, reference character CA denotes a cell array region and reference character PA denotes a peripheral region in which logic circuit transistors are to be formed. For clarity of description, two cell transistors and one logic circuit transistor are shown. The logic circuit transistor is assumed to be an NMOS transistor. Specifically, field oxide films 20 of FIG. 8 are formed on a substrate of a first conductivity type, for example, a P-well 1 to a thickness of about 4000 Å by, for example, LOCOS (LOCal Oxidation of Silicon), to electrically isolate the cell array region CA from the peripheral region PA and define an active region for the logic circuit transistor. Here, the P-substrate 1 can be replaced with a P-well formed by ion implanting boron (B) with a dose of about $7 \times 10^{14}$ atoms/$cm^3$.

Then, the buried diffusion regions of a second conductivity type, that is, high concentration $N^+$ buried diffusion regions 2 (see FIGS. 2B, 2C, 8, and 9) may be formed by ion implanting an N-type impurity such as phosphorous (P) with a dose of about $1 \times 10^{20}$ atoms/$cm^3$ into the substrate 1 exposed by a photo mask pattern. By forming the buried diffusion regions 2 in parallel in the cell array region CA as shown in FIG. 3, the channel length of a cell transistor is defined. That is, the distance between buried diffusion regions 2 in a column direction indicates a channel length. Here, it is to be noted that no buried diffusion regions 2 exist in the peripheral region PA of FIG. 3. Hence, each $N^+$ buried region 2 is positioned between channel regions defined in the cell array region CA to act as a source/drain.

Figure 7:
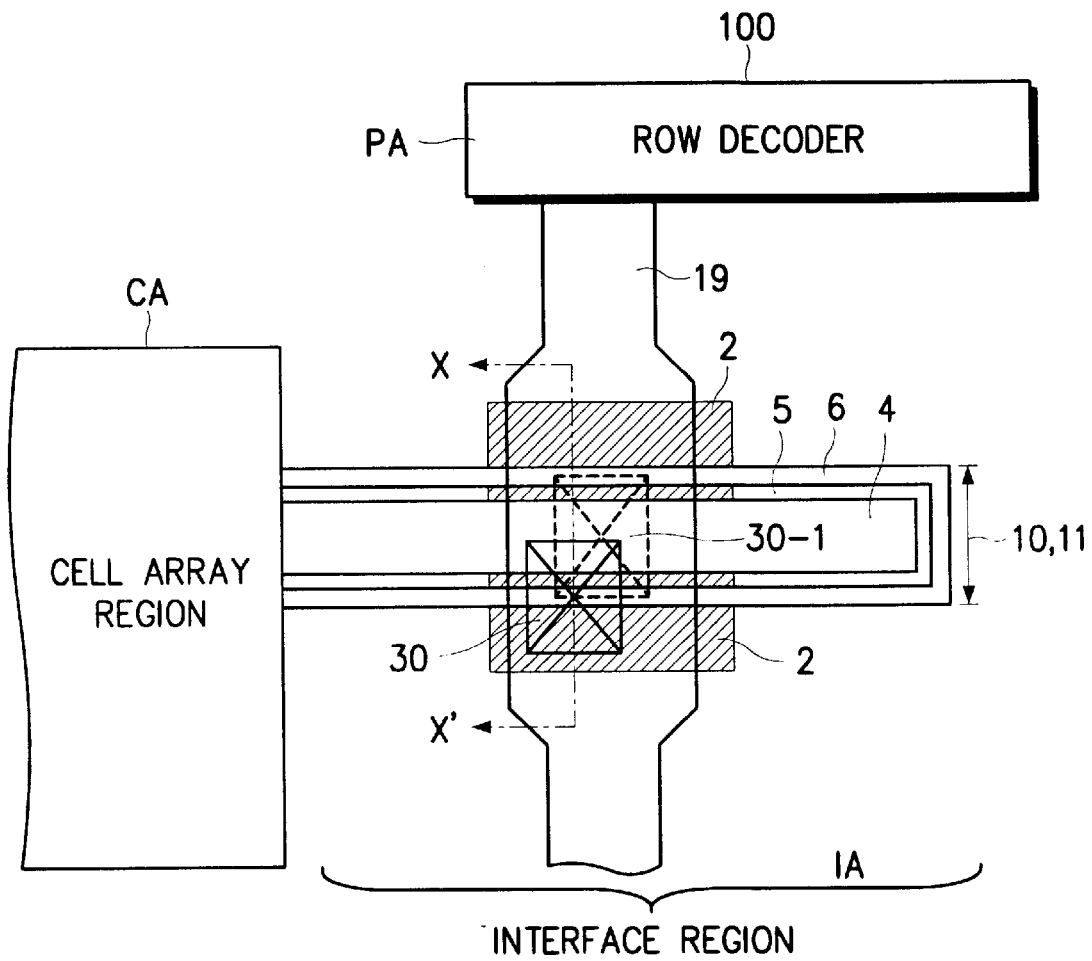
FIG. 7 is a view referred to for describing a word line contact for flat cells according to the present invention.
Figure 9:
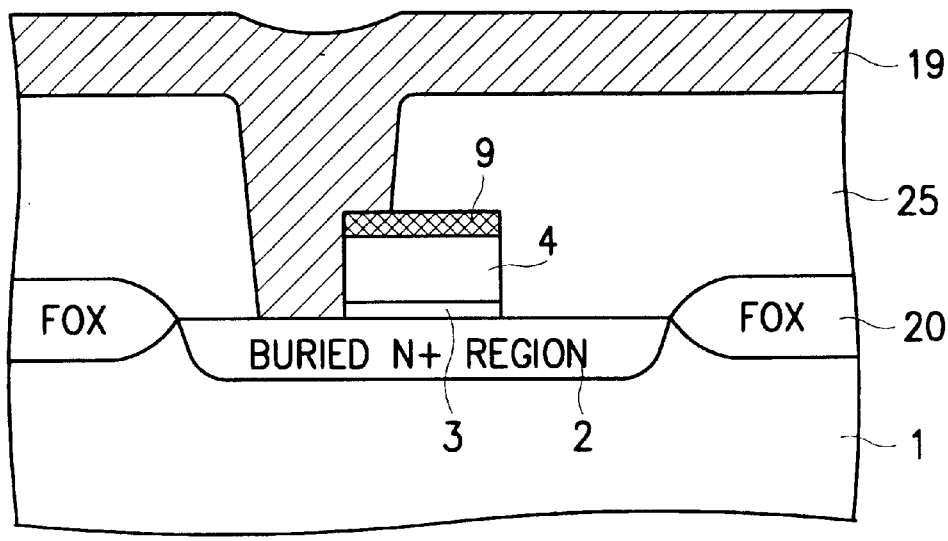
Figure 10:
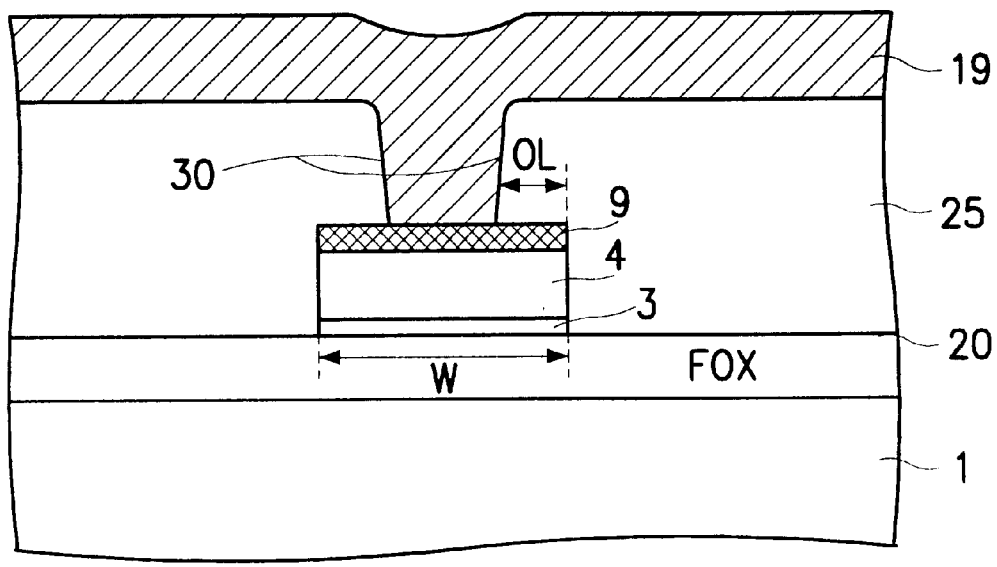
FIG. 10 is a sectional view of a conventional contact.

FIG. 7 is a view referred to for describing a word line contact for flat cells, which can save chip area, according to the present invention, FIG. 8 is a sectional view of a butted contact shown in FIG. 7 resulting from misalignment, taken along line X–X', and FIG. 9 is a sectional view of another butted contact with a different gate, also resulting from misalignment. FIG. 10 is a sectional view of a conventional contact.

To obtain a conductive pad for a word line contact simultaneously with formation of the buried diffusion regions 2 in the cell array region CA, a buried diffusion region 2 is formed into an island by field oxide films 20 of FIG. 8 on the semiconductor substrate 1 in an interface region IA between the cell array region CA and the peripheral region PA, as shown in FIG. 7. The buried diffusion region 2 of FIGS. 7 and 8 allows a butted contact to be formed.

In FIG. 10, the width W of a word line contact area is determined to account for a misalignment margin OL so that a contact hole 30 may be located within the surface of the gate poly 4 or a polycide layer 9 through an interlayer insulating layer 25, without crossing over part of an exposed substrate surface or the field oxide film 20. That is, the word line contact area is designed to be very wide, i.e., wider than the contact hole, thus precluding a butted contact, thereby limiting high integration.

In this contrast, in accordance with the present invention, the buried diffusion layer 2 is formed as an island in the field oxide film 20 as shown in FIGS. 7, 8, and 9, in order to use a butted contact for which a process margin against misalignment and variation in the critical dimension of skew is insignificant. This configuration allows cells to be packaged with high density and presents no obstacle to circuit operation.

Referring to FIG. 7, even if a word line contact 30-1 indicated by a dot line is shifted to the contact 30 indicated by a solid line due to misalignment, the buried diffusion region 2 allows the contact 30 to be formed as shown in FIG. 8. That is, the contact 30 is within the region 2 despite misalignment. A word line contact in the embodiment of the present invention refers to connection of a metal word line 19 for supplying an activation voltage to the poly word lines 10 and 11 acting as the gates of cell transistors. The metal word line 19 is generally connected to a row decoder in the peripheral region PA.

Referring to FIG. 3 again, after the buried diffusion regions 2 are formed, a gate oxide film 3 is formed on the overall surface of the resultant structure. Then, the gate regions 4 are formed in parallel to one another and extend along the interface region IA of FIG. 7. Simultaneously, a gate region 4-1 of the logic circuit transistor is formed on the gate insulating layer 3 in the peripheral region PA. As shown in FIG. 1, the word lines 4 are formed on the insulating layer 3, overlapping with the channel regions and intersecting the buried regions 2 in the cell array region CA. Here, the gate regions 4 and 4-1 can be formed of a doped polysilicon on the overall surface of the oxide film 3 and patterned by photolithography in the same step. Then, the exposed oxide film 3 is etched and the insulating layer 5 is deposited on the overall surface of the resultant structure to thereby cover the gate regions 4 and 4-1. The insulating layer 5 can be a high temperature silicon oxide film or a thermally grown silicon oxide film 50–550 Å thick.

Figure 4:
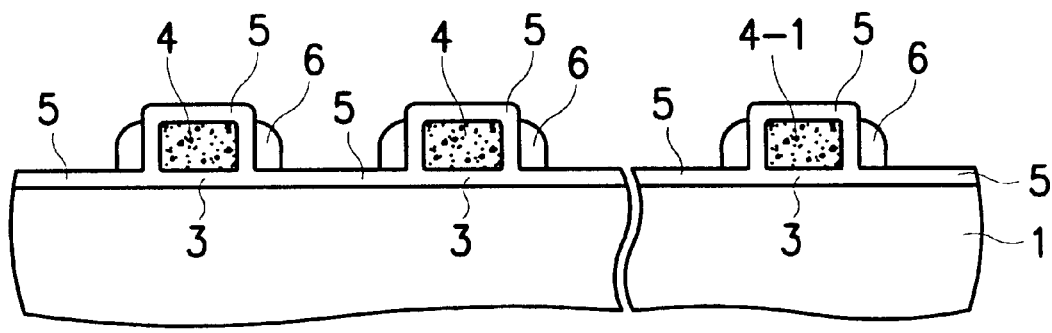

FIG. 4 illustrates the formation of the sub-gate regions 6. The sub-gate regions 6 are formed into spacers on the sidewalls of the insulating layer 5. If the sub-gate regions 6 are formed of a P-doped polysilicon, they are preferably 500–2000 Å wide. In an embodiment of the present invention, to form a composite word line, the sub-gate regions 6 are formed of the same material as that of the gate regions 4 and 4-1. The section of FIG. 4 results from deposition of the P-doped polysilicon layer on the resultant structure and etching back the deposited P-doped polysilicon layer.

Figure 5:
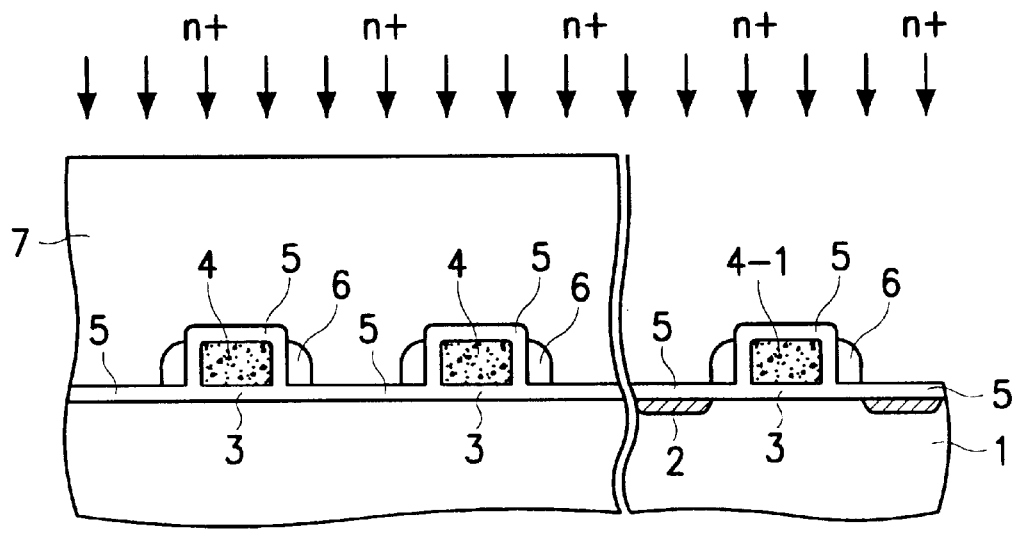

FIG. 5 illustrates the ion implantion for formation of the logic circuit transistor in an LDD structure to enhance operational characteristics. Referring to FIG. 5, a mask pattern 7 is formed to open only the peripheral region PA and an N-type impurity such as P or As (arsenic) is ion implanted into the substrate 1 to form a source/drain of the logic circuit transistor. The mask pattern 7 may be a photoresist film pattern, and in the case of As, for example, a doping level may be 5.0E15ions/$cm^3$ and an energy may be 50 KeV.

Figure 6:
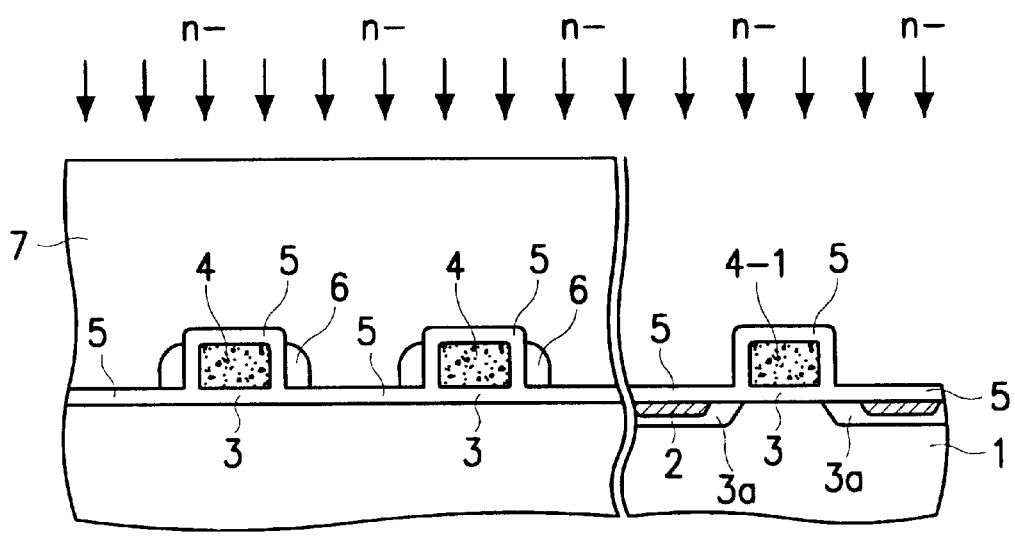

FIG. 6 illustrates the completion of the LDD structure. Referring to FIG. 6, the sub-gate regions 6 are removed from the peripheral region PA. Then, for example, P or As, serving as an $N^-$ impurity, is ion implanted into the overall surface of the resultant in the peripheral region PA with, for example, a dose of 2.0E13ions/$cm^3$ at an energy of 40 KeV. Thus, an LDD drain 3a is completed. The LDD structure is formed in self-alignment, without an N-source/drain photomask step in the embodiment of the present invention. If the logic circuit transistor is a PMOS transistor, $BF_2$ can be ion implanted as a $P^+$ impurity in formation of an LDD.

Referring to FIG. 8, a contact is formed following the completion of the LDD structure shown in FIG. 6. The mask pattern 7 is removed and the interlayer insulating layer 25 is formed on the overall surface of the resultant. Then, the word line contact hole 30 is formed through the interlayer insulating layer 25 and the insulating layer 5 in the interface region IA shown in FIG. 7. Even if the contact hole 30 is shifted from an intended location as shown in FIG. 8 due to possible misalignment and variation in the critical dimension of skew, the contact hole 30 can be narrower than the conventional width W. Then, a metal is deposited to fill the contact hole 30 and patterned so that the conductive pad 2, the gate region 4 as a word line, and the sub-gate region 6 are connected to one another by the metal word line 19. The metal may be one of aluminum, copper, and a refractory metal including tungsten, titanium, and molybdenum.

FIG. 9 illustrates a contact with the polycide layer 8 on the gate poly 4 given as a word line and the sub-gate regions 6 omitted, in the NOR-type mask ROM cell of the present invention.

As described above, a NOR-type mask ROM of the present invention is advantageous in that the current driving capability of cells is increased by preventing the surface of a substrate at a junction from being exposed. In addition, the mask of the present invention is cost effective since construction thereof reduces ion implantation mask steps, it operates at a low voltage and a high speed, and it can be highly integrated by using a butted contact as a word line contact.

While the present invention has been described in detail with reference to the specific embodiments, they are mere exemplary applications. Thus, it is to be clearly understood that many variations can be made by anyone skilled in the art within the scope and spirit of the present invention.

What is claimed is:

1. A NOR-type mask ROM comprising:
   a semiconductor substrate of a first conductivity type;
   a plurality of buried diffusion regions of a second conductivity type opposite to the first conductivity type, arranged in parallel on the substrate to serve as sources and drains wherein each diffusion region extends continuously along the semiconductor substrate;
   a plurality of channel regions defined between the buried diffusion regions;
   a plurality of gate insulating layers formed on the channel regions;
   a plurality of gate regions formed in parallel on the gate insulating layers, intersecting the buried diffusion regions, and overlapping with the channel regions, to serve as word lines;
   an insulating layer formed on the overall surface of the substrate, covering the gate regions; and
   a plurality of sub-gate regions formed into spacers on the sidewalls of the insulating layer, in parallel with the gate regions, intersecting the buried diffusion regions.

2. The NOR-type mask ROM of claim 1, further comprising a plurality of gate insulating layers formed on the buried diffusion regions.

3. The NOR-type mask ROM of claim 1, wherein said sub-gate regions are doped polysilicon.

4. The NOR-type mask ROM of claim 1, wherein said gate regions are one of metal polycide and doped polysilicon.

5. The NOR-type mask ROM of claim 1, wherein said sub-gate regions are 500–2000 Å wide.

6. A NOR-type mask ROM having a cell array region, an interface region, and a peripheral region, the NOR-type mask ROM comprising:
   a semiconductor substrate of a first conductivity type;
   a plurality of buried diffusion regions of a second conductivity type opposite to the first conductivity type, arranged in parallel on the substrate to serve as sources and drains;
   a plurality of channel regions defined between the buried diffusion regions, the channel regions being of the first conductivity type and defined in the cell array region;
   a plurality of gate insulating layers formed on the channel regions;
   a plurality of gate regions formed in parallel on the gate insulating layers, intersecting the buried diffusion regions, and overlapping with the channel regions, to serve as word lines;
   an insulating layer formed on the overall surface of the substrate, covering the gate regions;
   a plurality of sub-gate regions formed into spacers on the sidewalls of the insulating layer, in parallel with the gate regions, wherein
   the plurality of buried diffusion regions comprises
      a plurality of first buried diffusion regions of the second conductivity type arranged in parallel on the substrate to serve as sources and drains at both sides of the channel regions in the cell array regions, and
      a plurality of second buried diffusion regions formed into islands isolated by a plurality of field oxide films in the interface region, and
   the plurality of gate insulating layers are formed on the first and second buried diffusion regions in the cell array region and the interface region;
   a metal word line extended from the peripheral region, for supplying a voltage to the gate regions; and
   a butted contact formed across the gate regions and the second buried diffusion regions through the insulating layer in the interface region, for connecting the metal word line to the second buried diffusion regions and the gate regions.

7. The NOR-type mask ROM of claim 6, wherein the butted contact is formed across the sub-gate regions for connecting the metal word line to the second buried diffusion region, the sub-gate regions and the gate regions.

8. The NOR-type mask ROM of claim 7, wherein said metal word line orthogonally intersects the gate regions serving as word lines, for receiving an electrical signal from a row decoder in the peripheral region.

* * * * *